United States Patent [19]

Ramm et al.

[11] Patent Number: 5,766,984

[45] Date of Patent: *Jun. 16, 1998

[54] METHOD OF MAKING A VERTICAL INTEGRATED CIRCUIT

[75] Inventors: Peter Ramm, Pfaffenhofen; Reinhold Buchner, Unterföhring, both of Germany

[73] Assignee: Fraunhofer-Gesellschaft zur Foerderung der angewandten Forschung, Munich, Germany

[*] Notice: The term of this patent shall not extend beyond the expiration date of Pat. No. 5.563.084.

[21] Appl. No.: 532,367

[22] Filed: Sep. 22, 1995

[30] Foreign Application Priority Data

Sep. 22, 1994 [DE] Germany .............. 44 33 846.5

[51] Int. Cl.[6] .................................................. H01L 21/18
[52] U.S. Cl. ..................... 438/109; 438/462; 438/975
[58] Field of Search .................................... 437/915, 924, 437/208

[56] References Cited

U.S. PATENT DOCUMENTS

| 3,762,038 | 10/1973 | Ruggiero | 437/924 |
|---|---|---|---|
| 4,295,596 | 10/1981 | Doten et al. | 228/180 |
| 4,669,175 | 6/1987 | Ray | 437/924 |
| 4,829,018 | 5/1989 | Wahlstrom | 437/915 |
| 4,899,921 | 2/1990 | Bendat et al. | 228/105 |
| 4,983,251 | 1/1991 | Haisma et al. | 156/630 |
| 5,212,880 | 5/1993 | Nishiguchi et al. | |
| 5,266,511 | 11/1993 | Takao | 437/915 |
| 5,270,261 | 12/1993 | Bertin et al. | 437/209 |
| 5,376,562 | 12/1994 | Fitch et al. | 437/915 |
| 5,380,681 | 1/1995 | Hsu | 437/915 |
| 5,401,672 | 3/1995 | Kurtz et al. | 437/915 |
| 5,480,820 | 1/1996 | Roth et al. | 437/915 |
| 5,489,554 | 2/1996 | Gates | 437/208 |
| 5,536,974 | 7/1996 | Nishiguchi | |
| 5,563,084 | 10/1996 | Ramm et al. | 437/208 |
| 5,591,678 | 1/1997 | Bendik et al. | 437/208 |

FOREIGN PATENT DOCUMENTS 63-213943  9/1988  Japan ........................ H01L 21/88

Primary Examiner—John Niebling
Assistant Examiner—Kevin Turner
Attorney, Agent, or Firm—Karl Hormann

[57] ABSTRACT

A method of making a vertical integrated circuit by providing first and second substrates surfaces of which have layers with circuit structures and metallization planes therein, by providing an etching mask on a primary surface of the first substrate, forming via holes in the first substrate extending through the masking surface and the layers of the first substrate, reducing the thickness of the first substrate from a surface opposite its layer surface, alignedly connecting the first substrate by its reduced surface to the layer surface of the second substrate, subsequent deepening of the via holes to the metallization plane of the second substrate and forming electrical interconnection between the metallization planes in the first and second substrates through the via holes.

13 Claims, 3 Drawing Sheets

METHOD OF MAKING A VERTICAL INTEGRATED CIRCUIT

BACKGROUND OF THE INVENTION

1. Field of the Invention

The invention, in general, relates to a method of making a vertically integrated circuit and, more particularly, to a method of fabricating a vertically integrated circuit on a substrate which at a first primary surface has at least one device layer and at least one metallization plane.

As used herein, the term three-dimensional integration connotes the vertical interconnection of devices fabricated by planar technology. The advantages of a three-dimensionally integrated microelectronic system are, among others, that with substantially identical design rules, higher package densities and switching rates may be obtained as compared to two-dimensional systems. This is the result of shorter wiring paths or interconnections between individual devices or circuits, and because of the possibility of parallel data processing. The increased efficiency of the system is optimized by utilizing interconnection technology offering vertical interconnections which are freely selectable as regards their positioning and suitable for very large-scale integration (VLSI).

2. The Prior Art

The following methods of fabricating three-dimensional circuit arrangements with freely selectable vertical contacts are known:

Y. Akasaka, Proc. A 74 (1986), p. 1703, suggests initially to deposit and recrystallize polycrystalline silicon on a fully processed device layer so that further devices may be formed in the recrystallized layer. The disadvantages of such a method are the yield-reducing degradation of the devices in the lower level because of the high thermic stress induced by the recrystallization process and the necessarily serial processing of the overall system. They lead to correspondingly long cycle times during fabrication as well as to reduced yields because of accumulating process-inherent defects. Both increase manufacturing costs significantly as compared to processing individual layers in separate substrates.

Y. Hayashi et al., Proc. 8th Int. Workshop on Future Electron Devices, 1990, page 85, proposes first to fabricate individual devices separate from each other in separate substrates. Before they are bonded or joined together, the substrates are thinned down to a thickness of a few micrometers and provided with front and back leads. However, special processes such as MOS-incompatible material, e.g. gold, and patterning the back surface of the substrate, which are not used in the standard fabrication techniques of semiconductors, such as, for example, CMOS, are required to attach the front and back leads.

Japanese patent publication 63-213943 discloses a method of fabricating a vertically integrated circuit in which individual device layers are made separately from each other in separate substrates. An upper substrate is provided with via holes extending through all the device planes. The lower substrate is analogously provided with contact holes extending up to the metallization plane of this substrate. After thinning the upper substrate from its back surface down to the via holes, the two substrates are joined together in such a manner that the via holes of the upper substrate are positioned over the contact holes of the lower substrate so that a conductive path may subsequently be formed between both substrates.

However, the method disclosed by the Japanese publication suffers from the disadvantage that it requires complex designs since during alignment of the two substrates relative to each other the via holes (inter-chip vias) must not only be positioned within the limits of the metal structures of the lower substrate but also within the limits of the apertures of the contact holes. Their integration density is accordingly relatively low.

When connecting two completely processed device substrates together, they must be precisely aligned using alignment indicia, prior to their connection. Where structuring of the back surfaces of the substrates is to be avoided, the alignment indicia have hitherto been placed on the front surfaces of the substrates, and alignment has been accomplished by an infrared beam penetration method (Durchlichtverfahren) of the kind used in so-called flip-chip bonding methods. The sequence of the layers in the upper substrate at the time of connection precludes an optical alignment of the two device layers by penetration of light in the visual spectral range.

The application of an infrared penetration method requires special equipment which is non-standard in fabrication processes of common semiconductors. Thus, a bonding fixture provided with an infrared alignment feature is required. Furthermore, the surfaces of all the substrates to be aligned, including any handling substrate and the lower device substrate, must be polished; otherwise the infrared radiation would be dispersed at the interfaces and the alignment indicia could not be imaged. Even with polished surfaces, however, the preciseness of an alignment by infrared radiation, because of the longer wavelength, is inferior by about two orders of magnitude, compared to an alignment with light in the visual spectrum, so that the package density of the vertical connection is only about 25% of the value attainable with visual light. Moreover, the complex layer structure of an integrated circuit with its many interfaces and the reflections resulting therefrom, causes a further reduction in the precision of an alignment by a radiation penetration method. Also, such a method imposes restriction on the freedom of design as well as on the selection of substrates, as good radiation penetration is necessary within the areas of the alignment indicia.

The disadvantages of the mentioned prior art methods reside particularly in extended cycle or throughput times during fabrication, the use of special processes and equipment not compatible with CMOS, high manufacturing costs, reduced yields and/or reduced integration density.

OBJECTS OF THE INVENTION

It is accordingly an object of the present invention to provide a simplified method of making vertically integrated circuits in which the position of vertical interconnections is freely variable.

A more specific object of the invention is to provide a method of making vertically integrated circuits with techniques, materials and equipment compatible with the fabrication of common semiconductors.

Yet another object of the invention is to provide a method of the kind referred to which leads to high yields of, and high integration densities in, vertically integrated circuits fabricated by the method.

Other objects will in part be obvious and will in part appear hereinafter.

SUMMARY OF THE INVENTION

In a currently preferred embodiment of the invention, these and other objects are accomplished by a method of making a vertically integrated circuit including the steps of: providing a first substrate which in an area of a primary surface contains at least one layer of circuit structures and at least one metallization plane; depositing on the primary surface a mask layer for use in subsequent dry etching operations; sinking via holes in the area of the first primary surface through the mask layer and any circuit structure layers; connecting the first primary surface of the first substrate to an auxiliary substrate; reducing the thickness of the first substrate from the surface opposite its primary surface; providing a second substrate which in the area of a primary surface contains at least one layer of circuit structures and at least one metallization plane; aligning and connecting the first substrate by its surface opposite its primary surface to the primary surface of the second substrate; removing the auxiliary substrate; deepening the via holes to the metallization plane of the second substrate with the mask on the first substrate acting as an etching mask; and making an electrically conductive interconnection between the first and second metallization planes through the via holes.

BRIEF DESCRIPTION OF THE SEVERAL DRAWING

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

FIG. 1 is an exemplary representation of the operational sequence of the method in accordance with the invention, as exemplified on the basis of upper and lower substrates following different operational steps;

DETAILED DESCRIPTION OF THE PREFERRED EMBODIMENTS

Figure 1A:
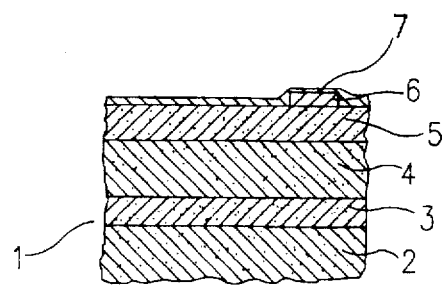
FIG. 1a depicts the upper substrate provided with a passivation layer on one of its surfaces.
Figure 1B:
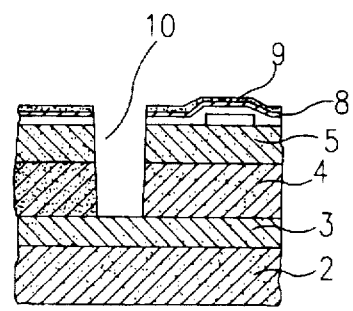
FIG. 1b depicts the upper substrate following the deposit of titanium nitride and plasma oxide layers, a trench photoetching operation, an oxide etching operation, a titanium nitride etching operation, an oxide etching operation, removal of photoresist and a trench etching operation in which a SiO₂ layer was used as an etching barrier)
Figure 1C:
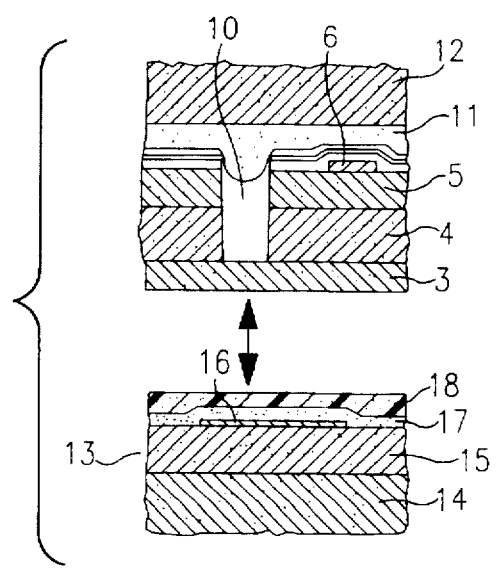
FIG. 1c depicts the upper substrate following deposit of an adhesion layer, mounting of a handling layer, thinning from its back surface by silicon etching (the SiO₂-layer acting as the etching barrier), and the lower substrate following passivation of one of its surfaces and deposit of an adhesion layer.

With reference to FIG. 1, there is shown a first substrate 1 such as, for instance, a silicon-on-insulation (SOI) disc, hereinafter sometimes called "wafer" or "upper substrate", comprising a silicon layer 2, a silicon dioxide layer 3 and another silicon layer 4. A chip layer 5 of the substrate 1 contains fully processed metal oxide semiconductor (MOS) circuits and is provided with triple-layered metallization 6 with an oxide and/or nitride passivation layer 7 protectively covering it (FIG. 1a). The upper layer of the metallization may, for instance, be an aluminum alloy. Below the metallization plane, there are provided doped and undoped oxide layers. Initially, a titanium nitride layer 8 and a hard mask plasma oxide layer 9 to be used as masks in subsequent dry etching processes, are deposited on the top surface of the substrate 1, and via holes 10 are formed by a so-called trench photo-etching process. Using a mask of lacquer or photoresist, the plasma oxide layer 9 and the titanium nitride layer 8, as well as further oxide layers of the chip plane 5 positioned below them, are anisotropically etched. Upon removal of the resist, the depth of the via holes 10 will be increased by the trench photoetching operation to the surface of the buried oxide layer 3, whereby the SiO₂ functions as an etching barrier. The resulting structure may be seen in FIG. 1b. A silicon disk 12 to be used as a handling substrate will then be connected to the wafer 1 by an adhesion layer 11, and thereafter the thickness of the wafer 1 will be mechanically, or by a wet chemical process, reduced from its back surface. Now the lower surface of the buried silicon dioxide layer 3 will act as an etching barrier.

Figure 2:
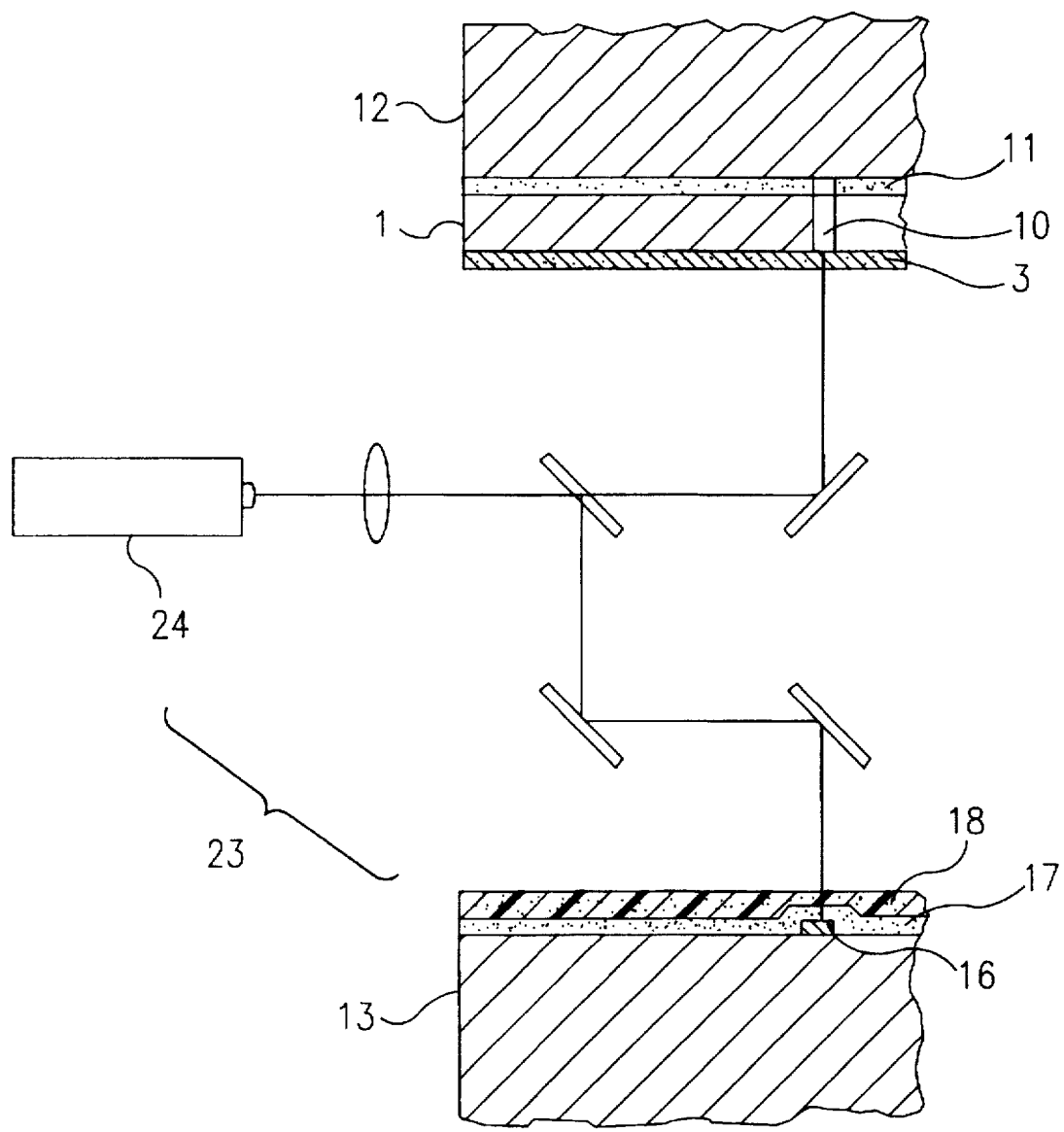
FIG. 2 is a schematic representation of the alignment operation of the upper and lower substrates by a split beam optical system.

A layer of polyimide 18 acting as an adhesive between chips is coated on a second substrate 13, hereinafter sometimes referred to as "lower" of "bottom substrate", comprising silicon layer 14, a chip layer 15 including fully processed MOS circuits therein, a triple-layered metallization 16 and a passivation layer 17. The polyimide layer 18 planarizes the upper surface of the substrate. As indicated by the up and down arrow in FIG. 1c, the upper substrate 1 and the lower substrate 13 are thereafter adhesively connected to each other in a disc bonding fixture (not shown) provided with an optical beam splitter 23 and a camera 24, schematically shown in FIG. 2.

Figure 1D:
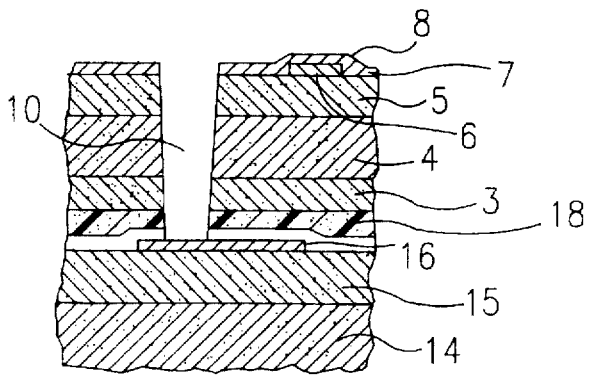
FIG. 1d depicts upper and lower substrates as a completed stack following their aligned adhesive connection, removal of the handling layer, removal of the adhesion layer, etching of the oxide and adhesion layers and etching of a protective layer.

Once the handling substrate 12 and the adhesion layer 11 have been removed, the disc or wafer stack formed in this manner may be further processed like an ordinary silicon disc or wafer. The buried oxide layer 3, the adhesion layer 18 and the protective layer 17 covering the metallization 16 in the former bottom substrate are subjected to an anisotropic etching process through the via holes 10, with the metallization 16 acting as an etching barrier 16 (FIG. 1d).

Figure 1E:
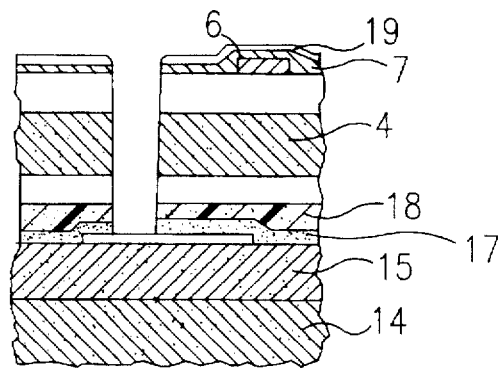
FIG. 1e depicts the stack after removal of the TiN-layer and deposit of an ozone-TEOS-layer.
Figure 1F:
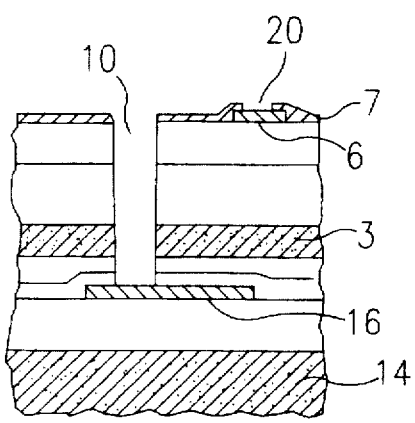
FIG. 1f depicts the stack following oxide spacer etching, a "Pad" photoetching process, oxide etching, removal of any photoresist and cleaning.

The titanium nitride layer 8, used as a mask for the dry etching process, will now be removed, and an ozone-TEOS-oxide layer 19 will be deposited. At the high aspect ratio of the via holes, the layer 19, because of high conformity during deposition, ensures that the metallization of the via holes 10 is electrical insulated from the silicon substrate (FIG. 1e).

Figure 1G:
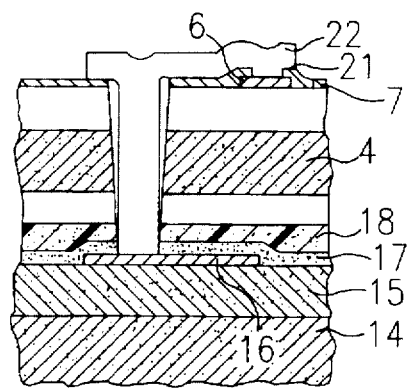
FIG. 1g depicts the stack following deposit of TiN and W-layers, a "Nailhead" photoetching process, tungsten and TiN etching and removal by convection heat of any photoresist.

By means of a precisely directed dry etching process, sometimes referred to as spacer etching, the side walls of the via holes will thereafter be passivated with the metallization action 16 acting as an etching barrier. After forming contact openings 20 over the upper metallization 6 by a so-called pad photoetching process, etching of the oxide (with the metallization 6 acting as an etching barrier), removal of the lacquer or photoresist and cleaning (FIG. 1f), a titanium nitride layer 21 is deposited as a bonding and barrier layer for a tungsten metallization 22 subsequently applied by tungsten precipitation in the via holes 10 extending between the upper and lower chips. After structuring the tungsten and titanium nitride layers 21, 22 by a photoetching process, such as the one known as "nailhead", which includes etching of the tungsten and titanium nitride layers, and removal by heat of any photoresist, the tungsten/titanium nitride layers 21, 22 will establish a vertical interconnection between the upper and lower devices (FIG. 1g).

From the foregoing it will have become apparent to those skilled in the art that the method in accordance with the invention offers distinct advantages over prior art methods.

Thus, in accordance with the invention, individual device layers in separate substrates are processed independently of each other, and they are subsequently joined. A first one of fully processed or finished substrates comprises at least one device layer and at least one metallization plane which in the final integrated circuit structure will be positioned above device layers of a further substrate. Initially, a mask, known as a hard mask, is applied to the front surface of the first substrate for the subsequent etching (for instance, dry etching) of dielectric layers (for instance, oxide and/or nitride layers). The mask may, for instance, be a layer of TiN, or it may be silicon deposited by sputtering.

The front surface of the first substrate is thereafter provided (as by etching) with via holes at positions at which a vertical interconnection is afterwards to be formed to device layers of the other or bottom substrate positioned therebelow. Preferably, the via holes penetrate through all the device layers and metallization planes in the upper substrate and terminate a few micrometers below the device layers of the first or upper substrate. If a SOI-substrate is used, the via holes preferably terminate at the buried oxide layer. After processing of the via holes an auxiliary substrate (handling substrate) is applied to the front surface of the upper substrate, as, for instance, by an adhesion layer. After that, the upper substrate is thinned down from its back surface. The thinning or reducing may be done by a wet chemical process or by mechanical or chemo-mechanical grinding. If an SOI substrate is used, the buried oxide layer will in this operation act as an etching barrier. If a conventional substrate, made of so-called bulk material, is used, the reduction may go as far as the via holes which will thus be open laterally toward both sides of the substrate.

Following this, the other fully processed substrate, also having at least one device layer and metallization plane, is connected or joined to the first substrate. For this purpose, the front surface of the further or bottom substrate which constitutes the outer surface of its upper device layer, is coated with a transparent adhesion layer. The adhesion layer may at the same time provide passivation and planarization. Following this, the upper and lower substrates are aligned relative to each other, and the back surface of the upper substrate is joined to the front surface of the bottom substrate. The alignment may be done with light in the visual spectral range, with the aid of alignment indicia and an optical beam splitting device. The alignment indicia may be provided in the top substrate in the same manner as the via holes, i.e. preferably by etching of alignment structures from the front surface through every device layer of the upper substrate; alignment indicia of the lower substrate may be provided in its metallization plane.

After the top and bottom substrates have been connected, the handling substrate is removed. The existing via holes will then be deepened from the front surface of the upper substrate through the remaining layers, such as, for instance, the oxide layer of any SOI substrate, adhesion layer, passivation layer of the bottom substrate, down to the metallization layer of a metallization plane in the bottom substrate. This may be done by dry etching with the hard mask on the upper substrate acting as an etching mask.

Finally, electrical interconnection between the metallization of the metallization planes in the upper and lower substrates is established by way of the via holes.

To this end, the side walls of the via holes are first insulated and contact holes leading to the metallization plane of the upper substrate are opened. Thereafter, a metal material is deposited on the surface of the upper substrate as well as in the via holes and in the contact holes. After structuring of this interconnecting metallization the vertical integration of the device layers of the upper and lower substrates is complete.

Because the individual device layers are parallel processed independently of each other in separate substrates, the method in accordance with the invention significantly reduces the cycle or through-put time during fabrication of the vertically integrated circuit structure. This, in turn, results in reduced manufacturing costs.

Preferably, in the method in accordance with the invention only CMOS-compatible technologies are utilized, since structuring of the back surfaces of the substrates is not required.

Forming the via holes in the individual substrates, i.e. on the wafer level, makes it possible that this process step is performed during the processing of individual substrates (parallel processing), thus leading to a further reduction in cycle and through-put times in the processing of multi-Layered device structures, i.e. stacked substrates fabricated by the method of the present invention. At the same time, the yield is increased.

Applying the mask layer (hard mask) on the top substrate at the beginning of the process and leaving the mask until such time as the via holes are opened, makes it possible at any time during the disc-stacking manufacturing process to perform etching operations on oxide and nitride layers of the kind used for passivation, planarization and multi-layered metallization. Opening of the contact holes in the bottom wafer before the substrates are joined together is no longer necessary. The only requirement is that for the alignment operation the via holes extending between the chips have to be positioned within the metal structures of the bottom substrate, so that requisite design or lay-out may be rendered less complex, and a higher integration density may be obtained (similar to the standard operation in multi-layered medullization).

Also, planarization of the bottom wafer with oxide layers may be done before joining since the oxide layers can subsequently be opened through the mask of the top substrate. This significantly reduced the possibility of voids being formed during the adhesive joining, and the three dimensional circuit structure is rendered more reliable.

Another advantage resulting from the method is the possibility of utilizing SOI substrates as top substrates since the buried oxide layer may after stacking also be etched without any problems. Hence, the advantages inherent in SOI materials may be made use of to the fullest. Among these advantages are: the potential use of the oxide layer as an etching barrier during thinning of the top substrate, the planar evenness of the back surface during adhesive joining, no corrosion of the via holes from etching fluids or because of chemical mechanical polishing during the reducing operation.

Because of the possibility of etching over the mask on the top substrate, vertical interconnections may be realized down to any metallization plane of the bottom wafer or the bottom stack. Hence, access is possible to any metallization plane of the stack thus providing significant freedom in the design of the integration.

Yet another advantage of the method in accordance with the invention resides in the fact that for aligning individual device layers in superposition, an optical beam splitter may be used for operation in the visual spectral range. In contrast to infrared radiation penetration techniques, neither the sequence of layers in the top substrate above the alignment indicia nor the sequence of layers in the bottom substrate below the alignment indicia need be transparent. A greater degree of precision in the alignment and a higher package density may be attained relative to infrared radiation methods.

It will thus be seen that the objects of the invention have been fully met by the novel process herein described.

What is claimed is:

1. A method of making a vertical integrated circuit, comprising the steps of:
    a) providing a first substrate comprising a first primary surface provided with at least one first layer having circuit structures and at least one first metallization plane therein;
    b) depositing a mask layer on said first primary surface for subsequent use in a dry etching process;
    c) forming at least one via hole in said primary surface penetrating said mask layer and said at least one first layer having circuit structures therein;
    d) connecting an auxiliary substrate to said first primary surface;
    e) reducing the thickness of said first substrate from its surface opposite said first primary surface;
    f) providing a second substrate comprising a second primary surface provided with at least one second layer having circuit structures and at least one second metallization plane therein;
    g) connecting said first and second substrates by placing said surface opposite said first primary surface and said second primary surface into aligned abutment with each other;
    h) removing said auxiliary substrate;
    i) deepening said at least one via hole to extend to said second metallization plane; and
    j) forming an electrically conductive interconnection between said first and second metallization planes through said via holes.

2. The method of claim 1, further comprising the steps of:
    k) providing first marking indicia in said primary surface and penetrating said at least one layer having first circuit structures, prior to connecting said first substrate with said auxiliary substrate;
    l) providing second marking indicia in said second primary surface; and
    m) aligning said surface opposite said first substrate and said second primary surface of said second substrate are by means of a visual light optical beam splitter cooperating with said first and second marking indicia.

3. The method of claim 2, wherein said first marking indicia comprise etchings in said first circuit structure layers and wherein said second marker indicia comprise metallic structures in said second metallization plane.

4. The method of claim 3, wherein said step of forming said at least one via hole comprises an etching process.

5. The method of claim 4, wherein said at least one via hole is formed to extend below said first circuit structure layers and wherein said reduction in thickness of said first substrate extends to said at least one via hole.

6. The method of claim 4, wherein said first substrate comprises an SOI substrate having an oxide layer therein and wherein said at least one via hole is formed to extend to said oxide layer and wherein said reduction in thickness extends to said oxide layer.

7. The method of claim 6, wherein said thickness is reduced by an etching process.

8. The method of claim 6, wherein said thickness is reduced by a grinding process.

9. The method of claim 6, further comprising the step of providing a transparent adhesion layer deposited on said second primary surface of said second substrate for connecting said first and second substrates.

10. The method of claim 9, further comprising the step of providing a second adhesion layer for connecting said first substrate with said auxiliary substrate.

11. The method of claim 10, wherein said transparent and said second adhesion layers are passivation layers.

12. The method of claim 11, wherein said transparent and said second adhesion layers are planarizing layers.

13. The method of claim 1, wherein said step of forming an electrically conductive interconnection comprises:
    forming at least one contact hole in said first layer opening to said first metallization plane of said first substrate;
    insulating the side wall of said at least one via hole; and
    covering and connecting said at least one via hole and said at least one contact hole with a metallic material extending between said first and second metallization planes.

* * * * *